(12) United States Patent  (10) Patent No.: US 6,816,033 B2
Richarte et al.  (45) Date of Patent: Nov. 9, 2004

(54) ELECTROMAGNETIC INTERFERENCE FILTER

(75) Inventors: Norman L. Richarte, Palmdale, CA (US); David E. Stanis, Palmdale, CA (US)

(73) Assignee: WEMS, Inc., Hawthorne, CA (US)

( * ) Notice: Subject to any disclaimer, the term of this patent is extended or adjusted under 35 U.S.C. 154(b) by 0 days.

(21) Appl. No.: 10/440,949

(22) Filed: May 19, 2003

(65) Prior Publication Data

US 2003/0206081 A1 Nov. 6, 2003

Related U.S. Application Data

(63) Continuation of application No. 09/620,866, filed on Jul. 21, 2000, now abandoned, which is a continuation of application No. 09/028,881, filed on Feb. 24, 1998, now abandoned.

(51) Int. Cl.⁷ .............................. H03H 7/01; H01G 4/35
(52) U.S. Cl. ..................... 333/182; 333/185; 361/302
(53) Field of Search ............................... 333/181, 182, 333/183, 184, 185; 361/302; 439/620

(56) References Cited

U.S. PATENT DOCUMENTS

| | | |
|---|---|---|
| 2,943,359 A | 7/1960 | Sussman |
| 3,074,149 A | 1/1963 | Rademaker et al. |
| 3,548,347 A | 12/1970 | Miller et al. |
| 3,638,144 A | 1/1972 | Denes |
| 4,700,155 A | 10/1987 | Sakamoto et al. |
| 4,747,019 A | 5/1988 | Ito et al. |
| 5,032,692 A | 7/1991 | DeVolder |
| 5,838,216 A * | 11/1998 | White et al. ................. 333/182 |
| 5,999,398 A * | 12/1999 | Makl et al. ................. 361/302 |
| 6,018,278 A | 1/2000 | Tang |
| 6,351,368 B1 * | 2/2002 | Kim ............................ 361/302 |

FOREIGN PATENT DOCUMENTS

| | | |
|---|---|---|
| DE | 03924108 A1 | 2/1990 |
| GB | 02277217 A | 10/1994 |

* cited by examiner

Primary Examiner—Robert Pascal
Assistant Examiner—Dean Takaoka
(74) Attorney, Agent, or Firm—Christie, Parker & Hale, LLP

(57) ABSTRACT

An electromagnetic filter has a pair of solder-in filters assembled together outside of a filter housing, inserted into, and soldered to the filter housing. The solder-in filters have a metal casing and a capacitor encapsulated within the metal casing and attached to the metal casing. A glass hermetic seal on one end of the solder-in filters reduces the risk of moisture entering the filter during the testing process and adversely affecting the electrical properties of the filter.

7 Claims, 2 Drawing Sheets

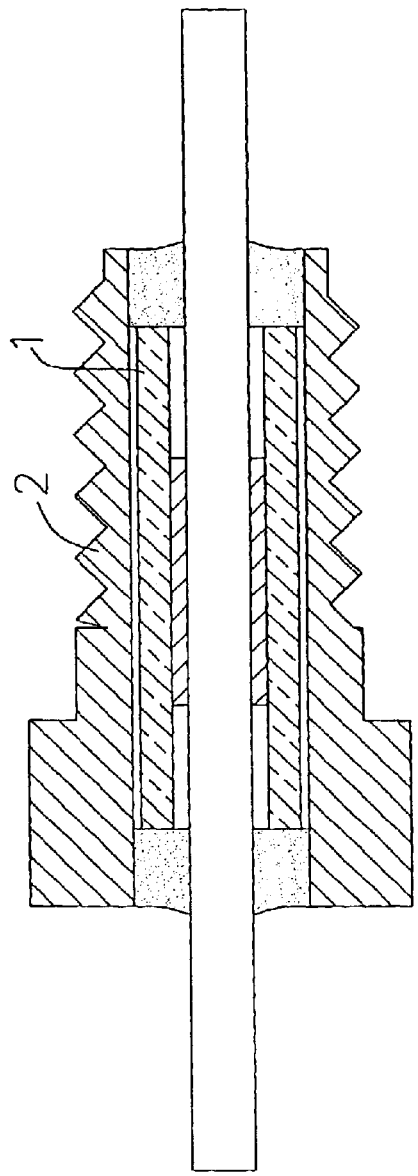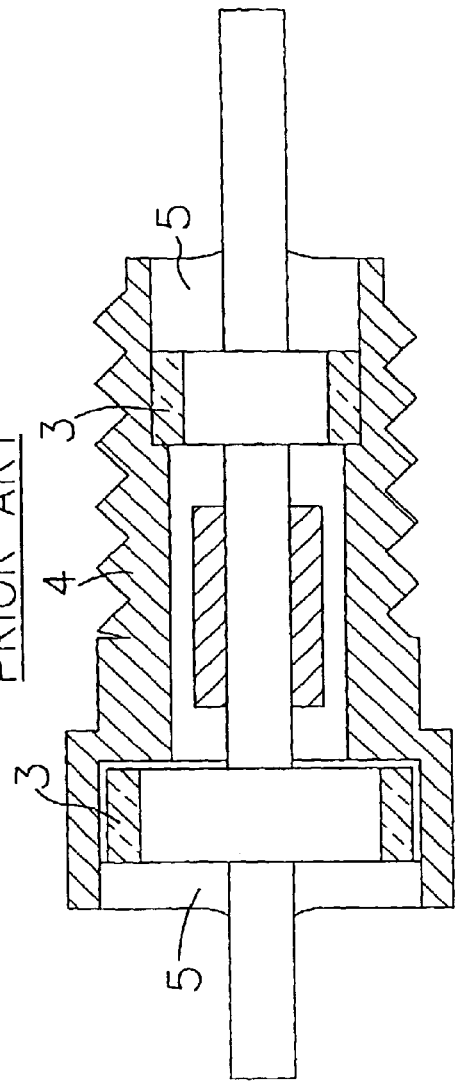

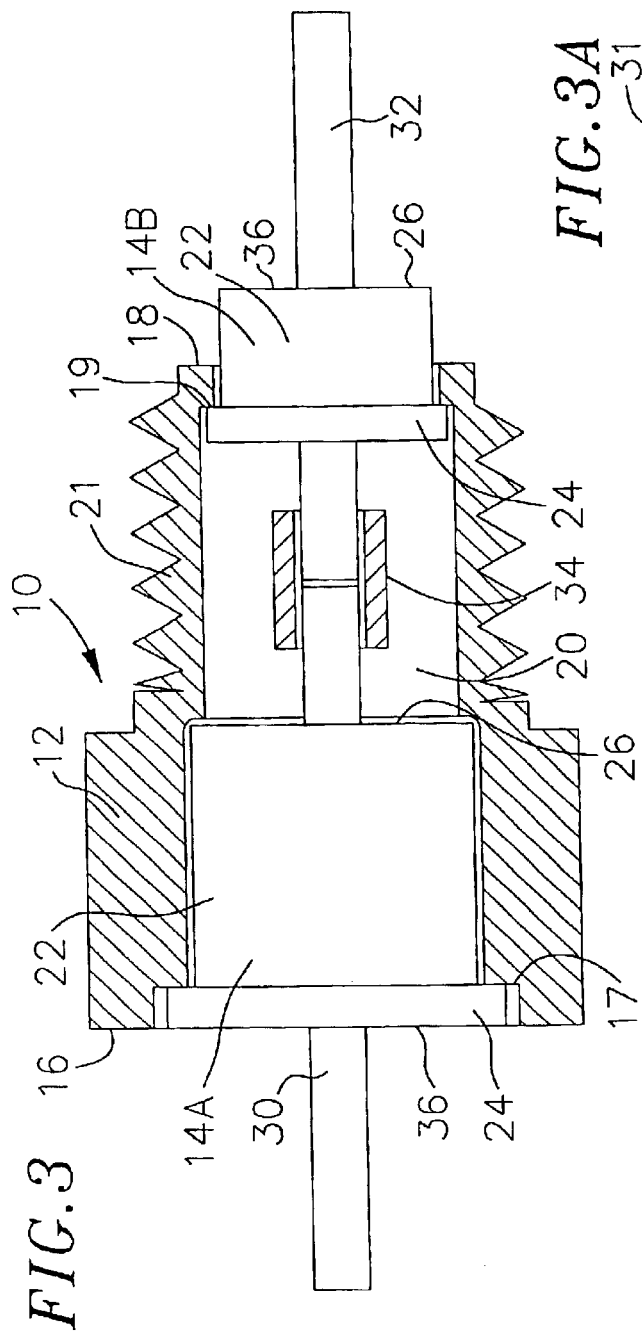
FIG.3
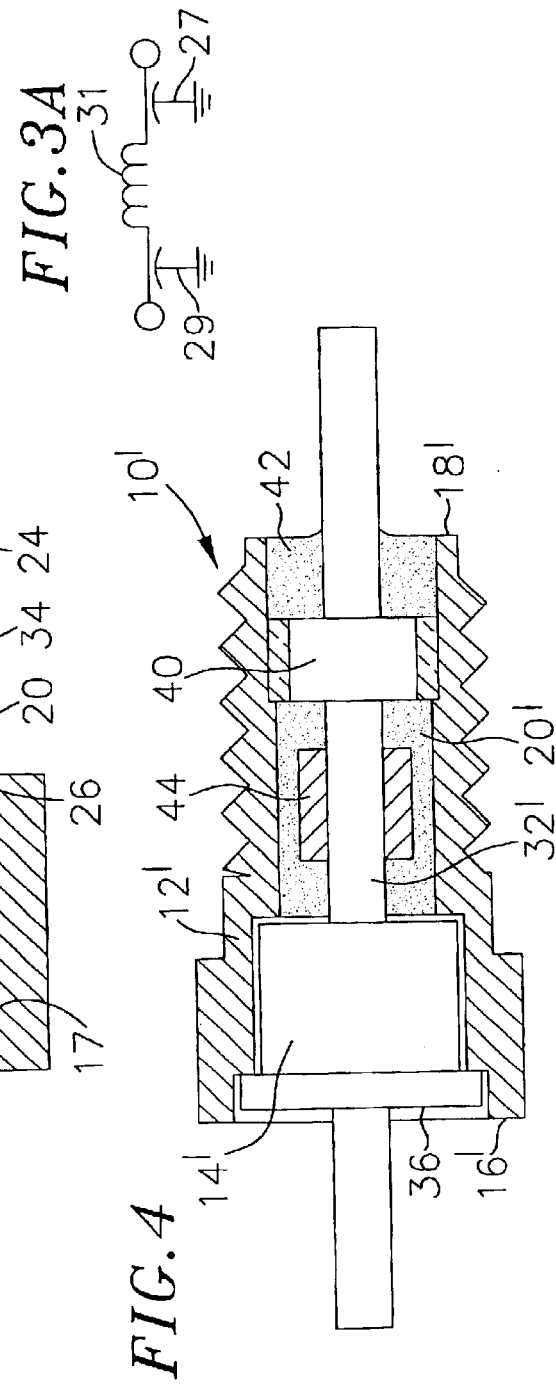
FIG.3A
FIG.4

ELECTROMAGNETIC INTERFERENCE FILTER

CROSS REFERENCE TO RELATED APPLICATIONS

This application is a continuation of U.S. patent application Ser. No. 09/620,866, filed Jul. 21, 2000 now abandoned which is a continuation of U.S. patent application Ser. No. 09/028,881, filed Feb. 24, 1998, now abandoned the entire disclosures of which are incorporated herein by reference.

FIELD OF THE INVENTION

The present invention generally relates to electromagnetic interference filters, and more particularly to an improved electromagnetic interference filter having a solder-in encapsulated filter construction.

BACKGROUND OF THE INVENTION

Electromagnetic interference (EMI) is generally any undesirable electromagnetic emission or any electrical or electronic disturbance which causes an undesirable response, malfunctioning or degradation in the performance of electrical equipment. EMI propagates through conduction over signal and power lines, and through radiation in free space.

EMI filters are often used to attenuate electromagnetic interference. Generally speaking, an EMI filter is a passive electronic device used to suppress conducted interference present on a power or signal line. The EMI filter may be used to suppress the interference generated by the device itself, as well as to suppress the interference generated by other equipment to improve the immunity of a device to the EMI signals present within its electromagnetic environment.

There are a wide variety of input, output, and signal line EMI filters designed for ordinary commercial applications, and for military, aerospace, space and other high reliability industrial and commercial applications. Generally speaking, high reliability EMI filters use components that have an established reliability or failure rate, and the final filter assembly is screened using various military, environmental, stress and other applicable tests and standards. Commercial EMI filters generally use standard off-the-shelf components and are not subject to the testing described above.

One of the most common types of EMI filters for ordinary commercial applications has a tubular capacitor filter construction. In this construction, soldering or conductive epoxy is used to attach a tubular capacitor 1 to a filter housing 2, as seen in FIG. 1. Although relatively simple to manufacture, certain disadvantages of tubular capacitors make this type of filter relatively unreliable. For example, microcracks are typically induced in the tubular capacitors during the assembly and testing process, and lead to dead shorts in the filter. Additionally, tubular capacitors tend to have a high degree of porosity resulting from the relatively small volume to thickness ratio of the capacitors, which has the effect of lowering the dielectric breakdown voltage of the capacitor. Moreover, mechanical torque during the installation process can cause cracks in tubular capacitors leading to dielectric breakdown, and electrical environment testing such as thermal shock and burn-in can cause thermal fractures in the capacitors which also lead to dielectric breakdown. As a result of these disadvantages of tubular capacitors, this type of filter is generally not used in high reliability applications.

For high reliability applications, an EMI filter having a discoidal capacitor filter construction is often used in place of the tubular capacitor filter construction discussed above. As seen in FIG. 2, in a discoidal capacitor filter construction, a pair of monolithic discoidal capacitors 3 are used in place of the tubular capacitor. As described above, soldering or conductive epoxy is used to attach the discoidal capacitors to the filter housing 4. Additionally, certain epoxies 5 can be utilized to encapsulate the capacitors, and any other internal components of the filter, to avoid damage during thermal shock and vibration.

The geometry of discoidal capacitors 3 makes this filter construction superior in many aspects in comparison to the tubular capacitor filter construction described above. For example, discoidal capacitors have a greater ability to withstand torque stress than tubular capacitors, and are also less prone to thermal stresses. Additionally, discoidal capacitors generally have a lesser degree of porosity than tubular capacitors, which improves breakdown voltage strength.

Despite these advantages, there are some disadvantages associated with the conventional discoidal capacitor filter construction described above. For example, there is significant difficulty associated with the soldering process during which the discoidal capacitors are attached to the filter housing. Although less porous than the tubular capacitors, the discoidal capacitors still exhibit some degree of porosity on their surfaces. This porosity makes the discoidal capacitors susceptible to flux contamination, as some of the flux present during the soldering process is captured by the capacitors. Additionally, contamination may occur in the reflowed solder and in the filter housing. Although there are various cleaners available for removing flux from the filter, the discoidal capacitor filter construction can never be completely washed clean. The presence of flux that cannot be completely removed compromises the electrical properties of the filter, such as the insulation resistance of the filter. Since there are two discoidal capacitors exposed to the soldering process, there is a strong likelihood of flux contamination in the conventional discoidal capacitor filter construction.

Another problem associated with the conventional discoidal capacitor filter construction is the possibility of capturing moisture in the filter. Since the filters are epoxy encapsulated, it is impossible to achieve a hermetic seal, and thus there is the potential for moisture being captured in the filter during the assembly and testing process. The filters are typically designed for an operating temperature anywhere in the range of −55 degrees Celsius to 125 degrees Celsius. The filters are often put through testing across this temperature range which can draw moisture into the filter or exacerbate problems related to any moisture already captured in the filter, affecting the electrical properties of filter.

As a result of these problems and disadvantages associated with the conventional discoidal capacitor filter construction, the yield per lot after assembly and testing is significantly low, and not acceptable for many high reliability applications. Consequently, a need exists for an improved EMI filter construction.

SUMMARY OF THE INVENTION

The present invention, therefore, provides an improved EMI filter construction to minimize the disadvantages associated with the prior art filter constructions. In a presently preferred embodiment, the present invention provides a solder-in filter construction, where a pair of solder-in filters are assembled together outside of a filter housing, and then inserted into and soldered in place inside the filter housing. Each solder-in filter comprises a capacitor encapsulated within and attached to a metal casing. Additionally, each solder-in filter includes a glass hermetic seal on one end of its metal casing.

In an alternate embodiment, a single solder-in filter is used in combination with an exposed discoidal capacitor. The exposed discoidal capacitor is used in place of one of the solder-in filters because the size of certain filter housings is such that presently available solder-in filters will not fit into the neck of such housing. Although this process utilizes an exposed discoidal capacitor, the risk factor associated with flux contamination and other problems associated with such a construction is reduced by 50% when compared to the conventional discoidal capacitor construction, as a result of the elimination of one of the exposed discoidal capacitors.

BRIEF DESCRIPTION OF THE DRAWINGS

These and other features and advantages of the present invention will be appreciated as the same become better understood by reference to the following Detailed Description when considered in connection with the accompanying drawings, wherein:

FIG. 1 is a longitudinal cross-sectional view of a prior art tubular capacitor EMI filter;

FIG. 2 is a longitudinal cross-sectional view of a prior art discoidal capacitor EMI filter;

FIG. 3 is a longitudinal cross-sectional view of a solder-in capacitor EMI filter according to the present invention;

FIG. 3A is a circuit diagram of the EMI filter of FIG. 3; and

FIG. 4 is a longitudinal cross-sectional view of an alternate embodiment of the EMI filter of FIG. 3, wherein a discoidal capacitor is used in combination with a solder-in capacitor.

DETAILED DESCRIPTION OF THE INVENTION

Referring now to the drawings, a presently preferred embodiment of the solder-in capacitor EMI filter 10 is illustrated in FIG. 3. The filter 10 generally comprises a bolt style housing 12, and a pair of solder-in, or encapsulated, filters 14A, 14B contained within the filter housing. The housing 12 has a first end 16, a second end 18 opposite the first end, an internal cavity 20 extending between the ends of the housing, and an externally threaded neck portion 21 adjacent the second end 18 of the housing. Additionally, the internal cavity of the filter housing includes a first lip 17 and a second lip 19 to facilitate soldering of the solder-in filters to the housing. In a presently preferred embodiment, the filter housing is constructed from brass or cold rolled steel and is plated with either tin, silver, gold or other suitable material.

Examples of suitable solder-in filters 14A and 14B are commercially from AVX Filters, series number ZZ and ZS.

Each solder-in filter comprises a metal casing 22, having a flanged end 24 and an end 26 opposite the flanged end. A capacitor (FIG. 3A) is encapsulated within and attached to the metal casing. The capacitor is attached to the metal casing using either a soldering process or a conductive epoxy. Prior to being used in filter 10, each solder-in filter is appropriately screened to ensure that it is void of any of the flux contamination problems described above.

Additionally, each solder-in filter includes a first lead 30, extending from the flanged end 24 of the casing, and a second lead 32, extending from the end 26 of the casing opposite the flanged end. As can be seen from FIG. 3, the second lead 32 of solder-in filter 14A is coupled to the first lead 30 of solder-in filter 14B. Preferably, a solder sleeve 34 is used to attach the two leads together with a very high temperature solder.

Preferably, the capacitors encapsulated within the metal casings are monolithic discoidal ceramic capacitors. The capacitors should be appropriately selected so that its characteristics, such as dielectric material, capacitance value, and voltage rating, are suitable for the ultimate application.

One advantage of the use of solder-in filters is the resulting high temperature that the encapsulated capacitor can withstand during the soldering process. When the solder-in filter is soldered to the filter housing, the temperatures can be as high as 300 degrees Celsius. During this process, the thermal stresses on an encapsulated solder-in capacitor are significantly less than those experienced by an exposed discoidal capacitor.

One end of the metal casing 22 of each solder-in filter has a glass hermetic seal 36, and the other end is sealed with an epoxy resin after the capacitor is attached to the metal casing. The glass seal 36 may be alternatively located on either end of the metal casing 22. "exterior end face"; (e.g. preferred embodiment, the glass seal 36 is located on the exterior end face of flanged end 24 of the solder-in filter 14A and on the exterior end face of end 26 opposite the flanged end of solder-in filter 14B.) The advantage of this configuration of the hermetically sealed ends of the solder-in filters is that once the solder-in filters have been assembled and positioned within the filter housing, the entire device is hermetically sealed, thus eliminating the risk of, and problems associated with, capturing moisture in the filter during the testing process.

In a presently preferred embodiment, the metal casing 22 of each solder-in filter is constructed from cold rolled steel. The leads 30, 32 are constructed from steel alloy 52 in order to be temperature coefficient compatible with the glass seal. Additionally, the epoxy is preferably a semi-rigid base epoxy that is compatible with the capacitor of the solder-in filter.

As mentioned above, an exemplary application for the filter 10 according to the present invention is space applications, and the filters may be used in satellites. The externally threaded neck portion 21 of the filter housing is threadably coupled to a hole in the chassis of the satellite designed to receive the filter. In this configuration, the first end 16 of the filter housing extends beyond of the satellite chassis. However, due to the positioning of solder-in filter 14A in the first end 16 of the housing, this end of the filter housing is hermetically sealed, and thus the filter is protected from the harsh environment typically associated with such applications.

The solder-in filters may be constructed as a "C" section, or feed through type, circuit which consists of only a capacitor 27, or as an "L" section circuit, which consists of a capacitor 29 and an inductor 31 coupled together. As can be seen from FIG. 3A, in a presently preferred embodiment, the solder-in filter 14B has a "C" section circuit and the solder-in filter 14A has a "L" section circuit, so that the resulting combination of the solder-in filters produces a "Pi" circuit. It should be clear to those skilled in the art, however, that any other filter or circuit types may be used with the present invention.

Preferably, the "L" section circuit incorporates an internal ferrite bead (not shown) that provides both inductance and resistance (lossy characteristics) which improves insertion loss of the filter. Additionally, the ferrite bead provides greater attenuation or performance at higher frequencies.

To construct an EMI filter according to the present invention, the two solder-in filters 14A, 14B are assembled together outside of the filter housing, preferably using the solder sleeve 34 to couple the two leads together with a very high temperature solder. Once assembled together, the solder-in filters are placed in the filter housing, and each solder-in filter is soldered to the filter housing 12. As can be seen from FIG. 3, the assembled solder-in filters may be inserted into the filter housing through the first end 16 of the housing. During the soldering process, the flanged end 24 of solder-in filter 14A is soldered to the first lip 17 of the filter housing, and the flanged end 24 of solder-in filter 14B is soldered to the second lip 19 of the filter housing. Since the capacitor elements are encapsulated within the metal casing there is no risk that they will be exposed to any flux contamination at this stage. When both solder-in filters are in place and soldered in the filter housing, the entire device is now hermetically sealed as a result of the glass hermetic seals of the respective solder-in filters. Thus, there is no threat of these filters capturing moisture during the testing process. Additionally, because the capacitor components are completely encased within the metal casing, the thermal and electrical stresses are significantly reduced as compared to an exposed discoidal capacitor soldered to the filter housing.

Referring now to FIG. 4, an alternate embodiment of the improved EMI filter 10' according to the present invention is illustrated. In the embodiment illustrated in FIG. 4, a single solder-in filter 14' is used in combination with a discoidal capacitor 40, instead of two solder-in filters being used in combination as in the previous embodiment. In this embodiment, a discoidal capacitor is utilized because the thread size of the filter housing 12' is smaller in size than in the previous embodiment, and solder-in filters presently commercially available will not fit into the neck of the housing.

In a presently preferred embodiment, the discoidal capacitor 40 is a NPO or X7R dielectric ceramic with nickel silver terminations. Discoidal capacitors of this type or having similar characteristics are available from AVX Corporation and Union Technologies.

Although the filter housing is smaller in size than in the previous embodiment, it is substantially identical in shape to the housing. As can be seen in FIG. 4, a solder-in filter 14' is soldered in a first end 16' of the filter housing 12', as illustrated in FIG. 4. The solder-in filter 14' is similar to the solder-in filter 14A of the previous embodiment. The second lead 32' of the solder-in filter 14' is sufficiently long enough to extend through the internal cavity 20' of the filter housing so that it may be soldered to the discoidal capacitor 40. Once the solder-in filter 14' is soldered in place in the filter housing, the filter housing is completely cleaned. The discoidal capacitor 40 is then soldered to the second lead 32' of the solder-in filter 14', and soldered in place in the second end 18' of the filter housing 12', as illustrated in FIG. 4, using a very controlled soldering process to assure just enough solder and flux is released to solder the capacitor in place with a minimal amount of contamination. In a presently preferred embodiment, a solder pre-form ring is used with minimum internal flux to solder the capacitor 40 to the filter housing 12'.

The filter is then cleaned and washed with suitable cleaners, such as alcohol, to remove the flux from the filter that may have accumulated during the soldering process. The area 42 above the soldered discoidal capacitor is then potted with epoxy.

Preferably, the filter 10' incorporates a ferrite bead 44. In one embodiment, the ferrite bead 44 is inserted into the internal cavity 20' of the filter housing 12' after the solder-in filter 14' has been soldered to the housing. Once the ferrite bead 44 has been inserted, the internal cavity 20' is preferably potted with epoxy to capture the ferrite bead before the discoidal capacitor 40 is soldered to the second lead 32' of the solder-in filter 14'.

Although this process still utilizes a discoidal capacitor and thus is susceptible to the problems and difficulties associated with that filter construction, the risk factor is reduced by 50% when compared to the conventional discoidal capacitor filter construction, as a result of the elimination of one exposed discoidal capacitor. Additionally, the use of suitable cleaners may be able to minimize the problems associated with flux contamination. Moreover, through the use of a very controlled soldering process, the risk factor can be reduced further, thus resulting in an expected yield factor significantly greater than that associated with the convention discoidal capacitor filter construction.

While various embodiments of this invention have been shown and described, it would be apparent to those skilled in the art that many more modifications are possible without departing from the inventive concept herein. It is, therefore, to be understood that, within the scope of the appended claims, this invention may be practiced otherwise than as specifically described.

What is claimed is:

1. An electronic filter capable of attenuating electromagnetic interference, the filter comprising:

a filter housing having a first end, a second end, and an internal cavity extending between the first and second end;

a first encapsulated filter positioned in the internal cavity conductively coupled to the first end of the filter housing such that an outer end of the first encapsulated filter faces substantially away from the internal cavity, and wherein the outer end comprises a hermetic seal; and a discoidal capacitor positioned in the internal cavity and conductively coupled to the first encapsulated filter and to the second end of the filter housing;

wherein the first encapsulated filter comprises a metal casing and a capacitor encapsulated within, and conductively coupled to, the metal casing, the metal casing comprising a flanged end conductively coupled to the filter housing and an end opposite the flanged end.

2. An electronic filter capable of attenuating electromagnetic interference, the filter comprising:

a filter housing having a first end, a second end, and an internal cavity extending between the first and second end;

a first encapsulated filter positioned in the internal cavity conductively coupled to the first end of the filter housing such that an outer end of the first encapsulated filter faces substantially away from the internal cavity, and wherein the outer end comprises a hermetic seal; and a discoidal capacitor positioned in the internal cavity and conductively coupled to the first encapsulated filter and to the second end of the filter housing;

wherein the first encapsulated filter comprises a metal casing and a capacitor encapsulated within, and conductively coupled to, the metal casing, the metal casing further comprising a glass hermetic seal on one end of the metal casing.

3. A method of constructing an electronic filter for attenuating electromagnetic interference, the method comprising the steps of:
- providing a first encapsulated filter and a second encapsulated filter, each encapsulated filter comprising a pair of leads, a metal casing, and a capacitor encapsulated within and conductively coupled to the metal casing, one end of at least one of the metal casing being hermetically sealed;
- conductively coupling one of the leads of the first encapsulated filter to one of the leads of the second encapsulated filter;
- inserting the coupled encapsulated filters into and positioning the coupled encapsulated filters within a filter housing through a first end of the filter housing;
- conductively coupling the first encapsulated filter to the first end of the filter housing; and
- conductively coupling the second encapsulated filter to a second end of the filter housing.

4. The method according to claim 3 wherein the providing step further comprises providing a first encapsulated filter and a second encapsulated filter each having at least one hermetically sealed end.

5. A method of constructing an electronic filter for attenuating electromagnetic interference, the method comprising the steps of:
- providing an encapsulated filter comprising a pair of leads, a metal casing and a capacitor encapsulated within and conductively coupled to the metal casing, one end of the metal casing being hermetically sealed;
- providing a discoidal capacitor having an internal diameter;
- conductively coupling the encapsulated filter to a first end of a filter housing;
- conductively coupling one lead of the encapsulated filter to the internal diameter of the discoidal capacitor;
- conductively coupling the discoidal capacitor to a second end of the filter housing; and
- sealing the second end of the filter housing with an epoxy.

6. The method according to claim 5 further comprising the step of washing the filter housing to remove flux contamination.

7. An electronic filter capable of attenuating electromagnetic interference, the filter comprising:
- a filter housing having a first end, a second end, and an internal cavity extending between the first and second end;
- a first encapsulated filter positioned in the internal cavity conductively coupled to the first end of the filter housing such that an outer end of the first encapsulated filter faces substantially away from the internal cavity, and wherein the outer end comprises a hermetic seal; and
- a second encapsulated filter positioned in the internal cavity and conductively coupled to the first encapsulated filter and to the second end of the filter housing, wherein the second encapsulated filter comprises an outer end that faces substantially away from the internal cavity;
- wherein the first encapsulated filter and the second encapsulated filter each comprise a metal casing and a capacitor encapsulated within, and conductively coupled to, the metal casing, the metal casing further comprising a glass hermetic seal on one end of the metal casing.

* * * * *